United States Patent
Clary

(10) Patent No.: US 9,917,561 B1
(45) Date of Patent: Mar. 13, 2018

(54) LOCATION ACTIVATED VOLUME CONTROL FOR VEHICLE

(71) Applicant: Wade Clary, Mission Viejo, CA (US)

(72) Inventor: Wade Clary, Mission Viejo, CA (US)

( * ) Notice: Subject to any disclaimer, the term of this patent is extended or adjusted under 35 U.S.C. 154(b) by 0 days.

(21) Appl. No.: 15/702,605

(22) Filed: Sep. 12, 2017

Related U.S. Application Data

(60) Provisional application No. 62/393,097, filed on Sep. 12, 2016.

(51) Int. Cl.
| | | |
|---|---|---|
| *H04B 1/00* | (2006.01) | |
| *H03G 3/20* | (2006.01) | |
| *H04R 1/02* | (2006.01) | |
| *A63B 57/00* | (2015.01) | |
| *B60C 5/00* | (2006.01) | |
| *G01S 19/13* | (2010.01) | |

(52) U.S. Cl.
CPC .............. *H03G 3/20* (2013.01); *A63B 57/00* (2013.01); *B60C 5/005* (2013.01); *H04R 1/028* (2013.01); *A63B 2220/12* (2013.01); *A63B 2225/50* (2013.01); *B60Y 2200/23* (2013.01); *G01S 19/13* (2013.01); *H04R 2430/01* (2013.01); *H04R 2499/13* (2013.01)

(58) Field of Classification Search
CPC  H04R 2499/13; H04R 1/028; H04R 2430/01; H03G 3/20; B60Q 5/005; G01S 19/13; A63B 2220/12; A63B 2225/50; A63B 57/00; B60Y 2220/23
USPC ......................................................... 381/86
See application file for complete search history.

(56) References Cited

U.S. PATENT DOCUMENTS

2015/0235671 A1\*  8/2015  Shahraray ............ G11B 27/105
386/248

\* cited by examiner

*Primary Examiner* — Paul S Kim
(74) *Attorney, Agent, or Firm* — Donn K. Harms

(57) ABSTRACT

A device and method for controlling the volume of played media through loudspeakers on a golf cart driven by a user with a Bluetooth connected device. A location receiver on the golf cart continuously signals a computing component a signal associated with a location of the golf cart on a golf course. If the golf cart is determined to be located in a volume control area, the volume of sound produced by an amplifier engaged with loudspeakers on the cart is reduced to a predetermined level for that control area. Other control areas can cause the playing of advertisements from the loudspeakers on the cart as it passes into them.

20 Claims, 4 Drawing Sheets

LOCATION ACTIVATED VOLUME CONTROL FOR VEHICLE

This application claims priority to U.S. Provisional Patent Application Ser. No. 62/393,097 filed Sep. 12, 2017 which is incorporated herein in its entirety by this reference thereto.

BACKGROUND OF THE INVENTION

1. Field of the Invention

The present invention relates generally to golf courses and golf carts employed thereon for the movement of golfers during a round. More particularly, it relates to a media or sound system for golf carts and the like which has terrestrial location activated volume controls for the sound system operatively positioned on the cart.

2. Prior Art

In recent decades drivers of vehicles have become more desirous of transportation, which in addition to providing a means to traverse a distance between locations, also provides entertainment. In prior decades, a simple radio provided vehicle occupants with voice and music which was heard over loudspeakers mounted in the vehicle. More modernly, vehicle occupants have been provided with an interactive graphic display and high fidelity sound which can reproduce sound and media from a variety of inputs.

As a result of the modernization and progression of ever more advanced and enhanced audio and video systems, riders in vehicles have become desirous of such in all their vehicles. Such has resulted in motorcycles with enhanced audio and video systems as well as boats and other pleasure vehicles. However, to date, a significant lacking of such enhanced audio systems is present in vehicles used for sports such as golf, where golf carts have been viewed as untiliarian and simply for quicker transport of golfers along the course to increase the throughput of paid golf rounds during a day.

As the sport of golf changes, the actual business of golf also continues to evolve. As a consequence, in addition to quickening the time players take to accomplish a round of golf, local golf courses have continued to seek new ways to increase their income from the business of golf.

While the provision of a welcome staff and course grooming to provide excellent playing conditions enhances a course's probability of capturing a local golfer market share, the enhanced revenues for such are limited. Other courses have started renting or providing for higher green fees amenities such as Global Position Systems which provide instant yardage to their golfer, or a top of the line golf cart with extra nice seats, and by allowing the use of music playing devices while playing a round of golf.

Additionally, because of age and demographics in the U.S., a new type of golfer is emerging onto the playing field these days, and course owners are taking note and seeking new ways to keep this younger demographic returning for rounds of golf for years to come. However, this new demographic of golfer is more technically savvy having grown up in a computerized age and has experienced driving a vehicle with enhanced audio and media technologies, and thus enjoys electronic gadgets. Currently, one of the electronic gadgets they are enjoying are portable Bluetooth enabled speaker devices that are capable of streaming music from a connected device. Such Bluetooth enabled amplified speaker devices are very convenient, and the technology has grown exponentially in recent years, and people are listening to music in every conceivable venue, including golf courses. While there is no United States Golf Association sound level restriction when listening to music or broadcasts during golf practice, on the driving range or during actual play on the courses (USGA Rule 14-3), course etiquette and the USGA does dictate that music not be listened to while hitting the ball, and such music should not be so loud as to inconvenience or upset other golfers.

As a consequence, use of a sound producing device such as a radio or Bluetooth enabled sound system on courses has provided challenges to course management and has become a conundrum. An absolute truism of golf course management is the desire for its players to enjoy their round of golf. Noise sensitivity of players is a constant concern on golf courses. Conversely, the desire to allow players the opportunity to listen to their music while not infringing with others concentrating on their game, or in a noise sensitive area such as staging, and outside dining areas is paramount.

As a consequence, there exists a delicate balance a golf course owner needs to maintain. In conventional golf course areas where loud noise and commotion is not desirable, course owners must strive to preserve the tranquility on their course. However, while maintaining tranquility is desired in those areas where required, course owners also must seek every revenue enhancing means to cater to the needs and desires of modern technically savvy golfers, to maintain the business of the course in a profitable fashion.

On courses where golfers are allowed to employ their own sound and media reproduction devices, there have been a growing number of complaints reported from other golfers seeking the more tranquil outdoor experience. The issue has developed from golfers enjoying their music a little too loudly when rolling up on other groups of golfers teeing off, putting, or driving their carts near homes adjacent the course. As a consequence, some course owners are now in an uncomfortable position where they wish to allow golfers to enjoy music to encourage their visits, but where they must concurrently also risk complaints from other golfers or local homeowners where that musical enjoyment goes overboard on volume.

The forgoing examples of related art in the field of music playing on golf courses and the like and limitations related therewith are intended to be illustrative and not exclusive, and they do not imply any limitations on the invention described and claimed herein. Various limitations of the related prior art will become apparent to those skilled in the art upon a reading and understanding of the specification below and the accompanying drawings.

OBJECTS OF THE INVENTION

It is an object of the present invention to provide what is known as the Tee Time Tunes Bluetooth speaker system which is configured to provide a solution to excess noise for both the golf course owners and the home owners around the course, while still enhancing music playing for golfing users who ride carts during a round of golf.

It is an additional object of this invention to provide such a Bluetooth speaker system which is adapted to increase and limit the gain provided by the digital amplifiers depending on cart location on a course, and thereby reduce and limit speaker volume when the golf cart nears and then enters preselected areas of the golf course but allow higher volume in less restricted areas.

It is yet another object of the disclosed invention herein to provide such a system which will automatically place the Bluetooth devices into a sleep or powered down mode after a designated amount of time has passed and prevents re-powering until an activation action by a user, to thereby eliminate the likelihood of mistaken pairing with another golf carts speaker system in the area.

These and other objects, features, and advantages of the present Bluetooth amplified sound invention and system herein, as well as the advantages thereof over existing prior art, which will become apparent from the description to follow, are accomplished by the method and/or improvements described in this specification and hereinafter described in the following detailed description which fully discloses the invention, but should not be considered as placing limitations thereon.

SUMMARY OF THE INVENTION

The disclosed device and method herein provide for enhanced sound from music or other media while riding in a golf cart, while concurrently providing the course owner or management with the ability to control volume levels on and around the course property automatically. Through the employment of embedded sensors, proprietary software adapted to the task of noise limiting in delineated terrestrial areas, in an easily installed water resistant system, an easily installed and cost-effective sound reproduction system is provided. The system and device is configured to adjust and self-limit the produced decibel levels emitted from loudspeakers according to the discerned location of the golf cart to which it is installed.

The system herein provides course owners with the ability to restrict the volume and use of music or other media being played through loudspeakers in particularly important areas such as the staging area, tee areas, putting greens and the like. Thereby providing course management with the comfort of ensuring that the appropriate and desired ambiance is provided in appropriate locations on and around the course. Concurrently, the course management is afforded the ability to provide golfers desirous of music or the like while riding on their golf cart, with an amplified Bluetooth engageable system providing louder volumes in appropriate course areas and volume adjustment during movement.

The system herein employs sensors along with location software adapted to the task of ascertaining positioning of the golf cart in terrestrial areas on a golf course. In this fashion, users riding golf carts having the device herein paired to their phone or media player or the like, will have limited access to audio volume produced by the paired device herein which receives a line out signal from the user device to the amplifier of the provided device herein. In terrestrial areas of the course where volume is restricted, a signal from the location software to the sound control software operating on the device will automatically lower the decibel level output. In areas where there is no or less restriction as to volume, or during periods of movement of the cart, limits will be lifted or significantly raised.

The system herein, once operatively engaged to a cart, provides the course owner a graphical interface produced on a display screen which depicts a map of the golf course. The depicted map allows the course owner to define perimeters of limited audio volume access areas which will thereafter restrict the decibel levels produced by the amplification system mounted on golf carts within the limited access areas. Active limited audio volume level access areas are communicated to the system running on the amplification device mounted on the golf carts, preferably through a wireless network. Such enables golf course management to adapt the limited volume access areas stored in electronic memory of each device in each cart, as golfing conditions change. Onboard terrestrial location sensors such as GPS cellular triangulation or other electronic means for determining location of the golf cart on a course, will thereafter detect the approach, entry, and departure of a golf cart from such limited volume access areas. Using volume or sound control software running in electronic memory of a computing component on the cart in operative engagement with the amplification device, the system will automatically adjust the output volume from the amplification device depending on the movement of the cart to positions on the golf course.

Such adjustment may include but may not be limited to maximum volume such as maximum decibels produced by speakers, reduction in volume from the maximum or from a current discerned decibel level, totally disabled volume, and increasing volume in areas of the course where allowed and during movement of the cart. The rules concerning volume changes can be adjusted according to the terrestrial position of the cart on the course, such as at or adjacent tees, fairways, greens, driving ranges, staging areas, cart return areas and parking lot areas. Management of the decibel level of loudspeaker-produced audio on such carts can be activated by a sensed GPS position and/or cellular triangulation and/or by a distance traveled sensed by an accelerometer, and/or by sensed proximity to beacons positioned on the course, or other location discerning means, thereby triggering such audio output level changes.

Especially preferred in all modes of the system is a required Bluetooth pairing of a cart mounted Bluetooth-enabled amplifier to a golfer's electronic media device. The output loudspeaker volume on each cart can thus be strictly controlled since the golfer will have no means to change volume produced by the cart-mounted audio amplifier except between predetermined levels. This required pairing thus satisfies any desire by a golfer to employ their own media device having the golfer's selected music and media stored thereon. Concurrently, the required pairing affords golf course management the ability to strictly control the decibel level of the volume from the loudspeakers of such a Bluetooth-enabled amplifier while limiting the golfer's ability to do so between predefined minimum and maximum volume levels.

Bluetooth speaker volume around a golf course is managed by defining maximum audio levels for controlled terrestrial areas predesignated on the golf course. During play, a golf cart's position is determined with a GPS receiver and/or accelerometer and/or cellular triangulation and/or by beacons or triggers on the course. The current determined position is compared in electronic memory of the computing device connected and controlling the amplification, with a stored digital golf course map, to determine if a predetermined controlled area with a respective determined maximum audio level area has been entered by the golf cart.

As each sequential terrestrial location of the golf cart is determined on an ongoing basis during a round of golf, the audio levels output by the loudspeakers of the Bluetooth-paired amplifier, are then managed by the volume-control software running in memory and a micro controller computing component. Volume levels may be reduced or silenced automatically in each determined control area sensed, based on a predetermined output level for each such area, and a concurrent restricting of any manual user input may also be initiated.

For example, a golfer driving a cart may input a command to increase the desired volume emanating from the loudspeakers engaged with the Bluetooth-paired amplifier of the system manually while entering or positioned in a predetermined audio volume controlled area. For the duration the golf cart is determined to be within the volume controlled area, any input to increase volume beyond a maximum for the determined respective volume controlled area, will be overridden thereby preventing speaker volume from being increased higher than a determined maximum. An input by a golfer to a volume lever lower than the maximum volume during positioning of a cart within a determined controlled area would of course be allowed.

The volume adjustment by sound control software operating for such, works within predefined parameters set forth by, for example, a Class D amplifier. The sound control software running in electronic memory will restrict the amplifier paired to the golfer's device to a maximum decibel output of, for example, 21 dB. The device, operatively engaged to the golf cart, will have the amplifier with a usable dB range of between 5 dB to 21 dB. If the max dB value is determined to have been reached for the terrestrial area on the course where the cart is located, the sound control software will not allow the connected sound amplifier driving the loudspeakers on the golf cart, to exceed the max dB value set forth for the respective golf cart location on the golf course. As noted, this maximum will vary depending on whether the cart is stationary, moving, within a control zone, or in between control zones. Further, amplifier output voltage sampling and/or an onboard microphone can also be included to automatically sense the dB output from the loudspeakers and adjust the volume according to the determined location on the course using the sound control software.

It should be understood that the embodiments discussed herein are not limited to golf carts and the like but are contemplated for use with any type of mobile asset, and particular any type of vehicle that can be made to move about where controlled volume areas are designated including automobiles and other conveyances, maintenance or grounds keeping machines, and the like. For purposes of illustrating the various aspects of the methods and systems, the discussion below will be primarily directed for convenience to describing exemplary embodiments directed to monitoring and controlling audio volume in volume control areas designated in and around a golf course.

Further, with respect to the above description, before explaining at least one preferred embodiment of the herein disclosed volume control system for paired Bluetooth devices in detail, it is to be understood that the invention is not limited in its application to the details of construction and to the arrangement of the steps in the following description or illustrated in the drawings. The Bluetooth connected volume limiting system described is capable of other embodiments and of being practiced and carried out in various ways which will become obvious to those skilled in the art on reading this disclosure. Also, it is to be understood that the phraseology and terminology employed herein are for the purpose of description and should not be regarded as limiting.

As such, those skilled in the art will appreciate that the conception upon which this disclosure is based may readily be utilized as a basis for designing and carrying out other Bluetooth enabled and amplified volume control systems. It is important, therefore, that the claims be regarded as including such equivalent construction and methodology insofar as they do not depart from the spirit and scope of the present invention.

BRIEF DESCRIPTION OF DRAWING FIGURES

Figure 1:
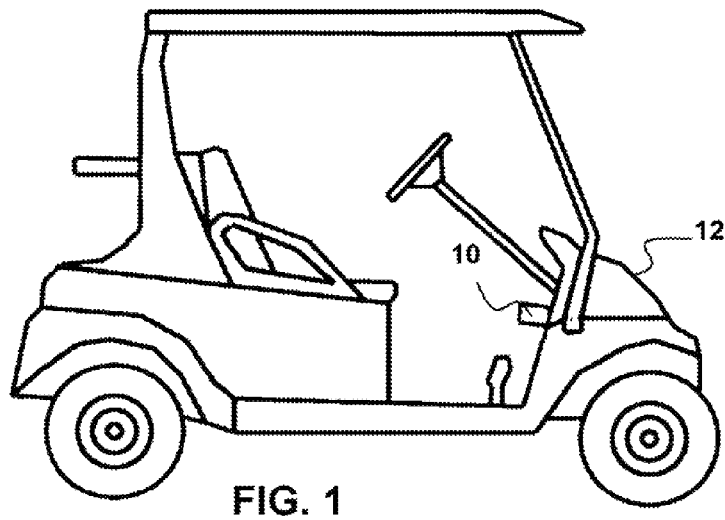
FIG. 1 depicts a side view of a conventional golf cart having the device herein operatively installed on the cart such as under the dashboard.

Other aspects of the present invention shall be more readily understood to those skilled in the art when considered in conjunction with the above noted accompanying drawings, and the following detailed description, neither of which should be considered limiting in any fashion whatsoever.

DETAILED DESCRIPTION OF THE PREFERRED EMBODIMENTS OF THE INVENTION

Now referring to drawings of FIGS. 1-6, where similar structures are labeled with like numerals. While each figure may not include all the reference numerals referred to in the paragraphs of this specification, the figures should be referred to as a whole for any numeral which is described in a subsequent figure but not shown. Thus, a reference to a structure by numeral in any subsequent figure after that structure is identified by that reference numeral is considered to refer to any subsequent or previous drawing which shows the structure with that reference numeral.

FIG. 1 depicts side view of a conventional golf cart 12 having the device 10 herein operatively installed on the cart 12 such as under the dashboard. All required electric power to operate the device 10, such as is shown graphically in FIG. 2, for the audio amplifier 14, the computing component 16 controlling the amplifier 14, the locational receiver 26, the accelerometer 32, and the operatively connected electronic memory 18 for operational software herein controlling the system herein to run in combination with the computing component 16 is provided by the onboard electric power from the golf cart 12 which is well known and need not be described.

Figure 2:
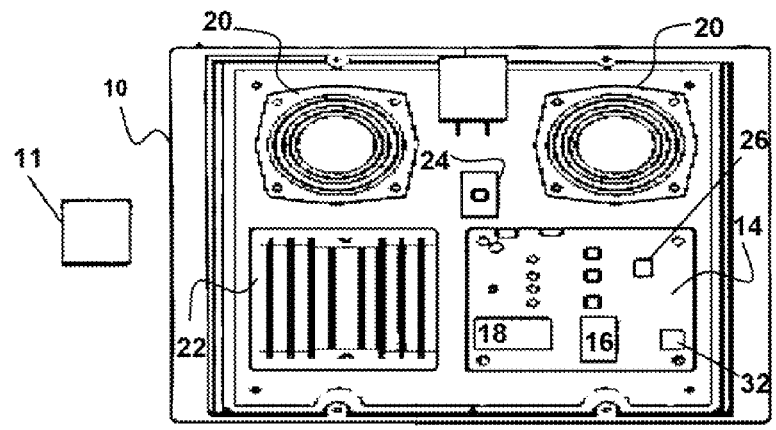
FIG. 2 is a graphic depiction of the device herein showing the speakers, the controller, and other operative components.

Shown in FIG. 2 is a graphic depiction of the device 10 herein showing the loudspeakers 20 which are powered to emit sound by the connected audio amplifier 14 such as a Class D audio amplifier 14. The computing component 16, in operative engagement with the audio amplifier 14, will control the decibel level of sound emitted by the loudspeakers 20 using sound control software running in electronic memory 18 and on the computing component 16, which uses a discerned decibel level of sound being emitted and operates to cause an electronic control to vary the input volume signal to the audio amplifier 14 itself or to vary the output volume signal communicating to the loudspeakers 20 from the audio amplifier, to thereby limit the decibel level of sound being emitted to a maximum level. Thus, each golfer who takes possession of a cart 12, if they wish to have music or other media broadcast while in the cart 12, will first be required only to use a Bluetooth capable electronic component which will provide the sound to be broadcast by the loudspeakers 20. This will prevent the use of other sound producing devices while on the cart 12.

For example, the output audio volume level of the loudspeakers 20 can be constantly sampled by a volume sampling component such as a microphone 24 which receives sound emitted from the loudspeakers 20 and sends a feedback signal to the sound control software and computing component 16 representative of the decibel level being emitted from the loudspeakers 20 at any given moment. This feedback signal would be precalibrated such that known feedback signal levels from the microphone 24 are related with known or measured decibel levels of sound emitted by the loudspeakers 20. Alternatively, the volume sampling component can be a voltage monitor which samples the input voltage levels to the amplifier, or the output voltage levels from the amplified output of the amplifier to the loudspeakers 20, can be sampled, and associated with a known or measured decibel level of sound emitted by the loudspeakers 20.

Thus, once the microphone 24 communicates an electronic volume signal level, or once an input voltage level or output voltage level of the amplifier is sampled to determine the electronic volume signal level or output audio volume level, that output audio volume level is compared with a stored database 18 of audio levels listing the maximum decibel level allowable for the output audio volume level from the speakers 24 while the cart 12 in a determined control area 50. The sound or volume control software running in electronic memory operates to control the maximum decibel level or output audio level of the loudspeakers 20. In doing so, the sound or volume control software, will operate conventional electronic switching to decrease the audio input signal to the class D or similar amplifier 14 and/or the audio output signal from the amplifier 14 to the loudspeakers 20, and thereby lower the emitted decibel level of the output audio volume level emitted from the loudspeakers 20 if that output audio volume level exceeds a predetermined threshold level, for determined map coordinates 30 for the location of the golf cart 12 on a course.

Sound control software operating for the task of volume control running in electronic memory 18 and on the computing component 16 such as a microprocessor can thus control the decibel level of the output audio volume level emitted sound from the loudspeakers 20, depending on the terrestrial location of the golf cart 12 on a golf course, as determined by the output location signal from the locational receiver 26 and/or the accelerometer 32 as explained further herein.

A DC to DC power converter 22 is operatively connected to the electric system of the golf cart 12 such as, for example, wires communicating with a 12 volt battery. Electric power from the power converter 22 connected to the electric power of the golf cart 12 is communicated to all of the components needing it for the device 10 herein, such as audio amplifier 14 and computing component 16 and any other components in a conventional fashion via wiring or circuits on a PCB board or the like, at the proper voltage and current levels as is well known in the art.

Figure 3:
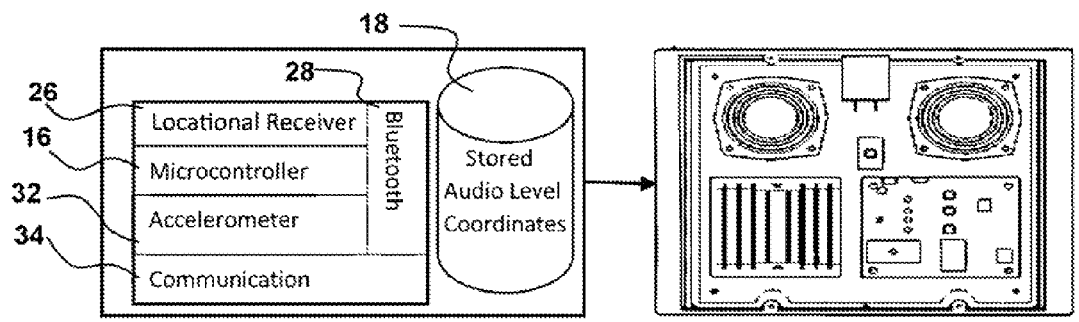
FIG. 3 depicts the operation of the software-enabled controller herein to control volume levels generated by the amplifier and emitted from the loudspeakers.

Shown in FIG. 3 is a graphic representation of the operation of the software-enabled micro controller or computing component 16 controller herein, to control the decibel levels or output audio volume level emitted by the loudspeakers 20. In the system herein, a golf cart 12 having the device 10 herein mounted thereon, varies the output audio volume or decibel levels emitted by the loudspeakers 20 based upon the determined terrestrial location of the golf cart 12 on a golf course from the location signal output by the locational receiver 26.

This location determined by the locational receiver 26 will be communicated from the locational receiver 26 to the location software running in electronic memory. The locational receiver can be one or a combination of locational receivers from a group including, a GPS receiver, a receiver configured for cellular triangulation, an accelerometer 32 shown in FIG. 2 which can access movement and speed to determine location, or a receiver configured for receipt of local electronic signals from a golf course-positioned beacon. Individual or combined electronic signals communicated one or a combination of such locational receivers 26 will be output in an electronic location signal, such as, for example, GPS coordinates associated with course map coordinates 30, and the location signal will provide device 10 and sound control software and other software requiring it, an ongoing and precise terrestrial location signal of the golf cart 12 at all times.

A Bluetooth receiver 28 will pair with a Bluetooth enabled electronic device 11 of a golf cart 12 occupant, and communicate the sound signal or input signal from the user device 11, to the input side of the amplifier 14 for sound amplification and communication from an output in an amplified output signal, to the loudspeakers 20 for emanating sound. In electronic memory 18 along with software operating the system, is stored a database of electronic map coordinates 30 which are pre-associated with a database of maximum decibel levels 19 for the output audio volume level (FIG. 5) to be emitted from the loudspeaker 20 at any identified respective terrestrial location coordinate on the golf course.

When the locational receiver 26, which as noted may include one or a combination of locational receivers from a group including, a GPS receiver, a receiver configured for cellular triangulation, an accelerometer 32 which can access movement and speed to determine location, or a receiver configured for signals from a golf course positioned beacon, communicates output locational signal of a determined location of the cart 12, to the location control software running on the computing component 16, and the locational signal when compared with map coordinates 30 stored in electronic memory 18 shows the golf cart 12 has reached a map coordinate 30, determined to be located within a controlled area 50 on the golf course (FIGS. 5-6), a predetermined maximum output audio volume level held in electronic memory 18 for the loudspeakers 20, which is associated with map coordinates 30 within controlled area, is determined and the location software will communicate with sound control software of the determined location and levels as being controlled.

Thereafter, if the input or output signal sampling or the electronic sound signal from the microphone determines the loudspeakers 20 are exceeding that maximum output volume audio level, the sound control software operating to control volume level associated with the determined controlled areas 50, will operate to electronically switch and lower the input audio signal or output audio signal of the amplifier 14. This action will thereby automatically lower the decibel level of the output audio volume level emitted by the loudspeakers 20 to one equal to or less than the maximum output audio volume level, associated with the map coordinates within an identified control area 50 on the golf course. There can be multiple control areas 50 identified on the golf course and each can have a different associated maximum audio volume level for each respective control area 50.

Additionally, an accelerometer 32 shown in FIG. 3 can be included to ascertain movement and stationary positioning of the golf cart 12. Because noise is generated by movement, once such is discerned by the accelerometer 32, an electronic movement signal can be sent to the computing component 16 and input to the volume controlling the output audio volume level, based on the location signal identifying the map coordinates 30 and terrestrial location of the golf cart 12. The output audio volume level or decibel level emitted by the loudspeakers 20 can be increased when movement is sensed by the accelerometer 32 to overcome noise of movement, and when movement ceases, the sound control software will operate to lower the decibel level of the output audio volume level and sound emitted from the loudspeakers 20. Of course at all times the output audio volume level emitted will be equal to or lower than the maximum volume level associated with the map coordinates 30 determined by the location signal from the location receiver 26 of the location of the golf cart 12 on the course.

Additionally shown in FIG. 3 is the network communication 34 component such as a wired or preferably a wireless network card operatively connected with the computing component 16 and electronic memory 18. Communication software running in electronic memory 18 and on the computing component 16, will allow the stored map coordinates 30 which are located in and identify a sound control area 50 of the golf course, to be adjusted as courses or conditions change over time. The database of maximum output audio volume levels 19 associated with map coordinates 30 within a respective control area 50 can also be changed via the wireless link as needed.

Figure 4:
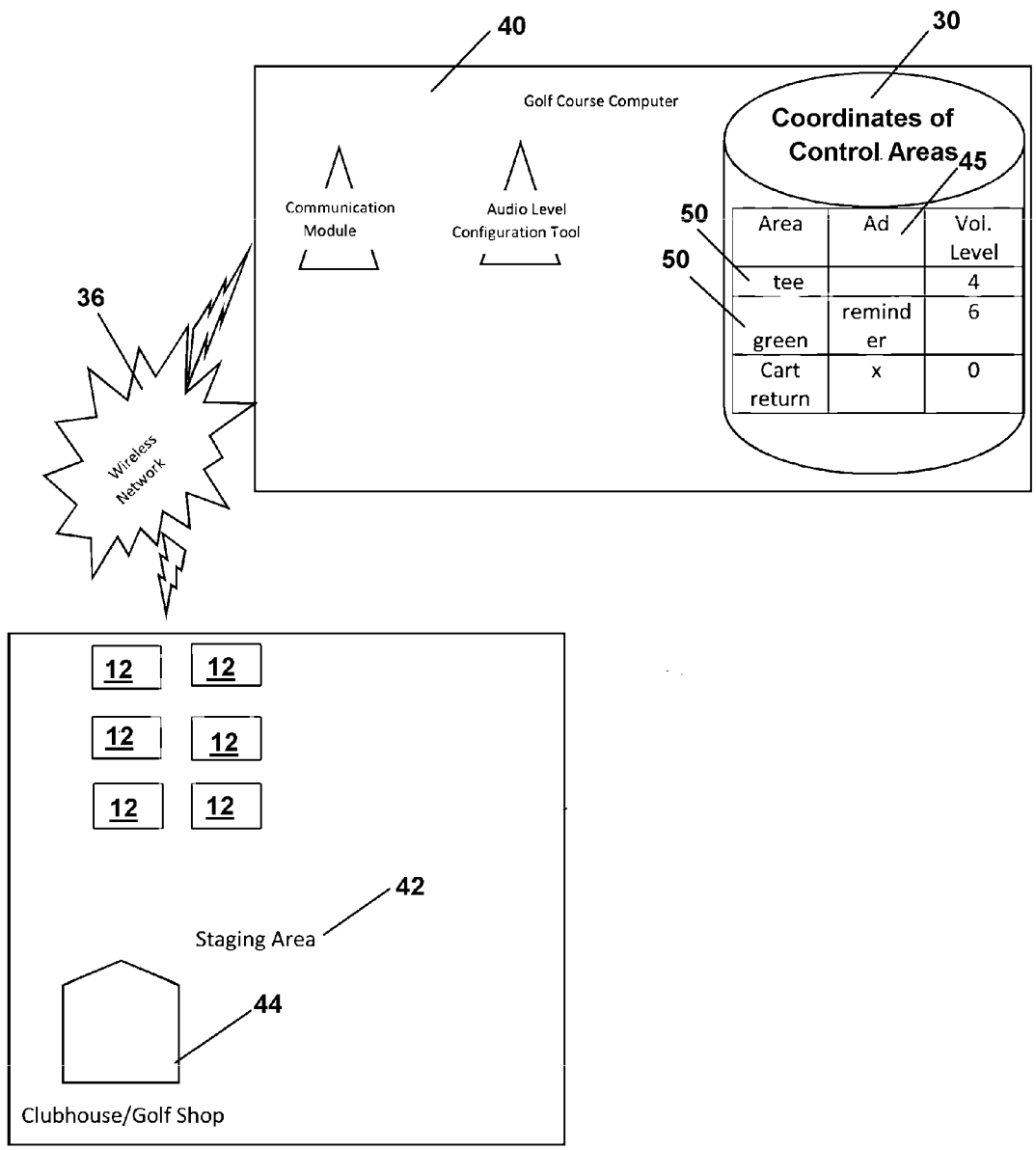
FIG. 4 shows the communication of course location control areas to golf carts positioned in a staging area such as adjacent a pro shop.

Such wireless network communication and updates and wireless configuration is shown in FIG. 4 where a wireless network 36 will communicate the map coordinates 30 associated with control areas 50 or 46 from a server 40 to carts 12 while stored or stationary in a staging area 42 such as near the clubhouse 44.

Additionally, advertisement map coordinates 45 can also be associated with designated course control areas or ad areas 46 where an advertisement or informational announcement may be triggered to play on the device 10 at a predetermined volume level for each ad area 46. Consequently, when a location receiver 26 herein sends a signal to the device 10 that a cart 12 is at map coordinates within an ad area 46, a designated ad 45 associated with the ad area 46 is played upon the device 10. Such an advertisement can be a reminder or warning about upcoming parts of the golf course, or for example, specials at the golf course restaurant.

Figure 5:
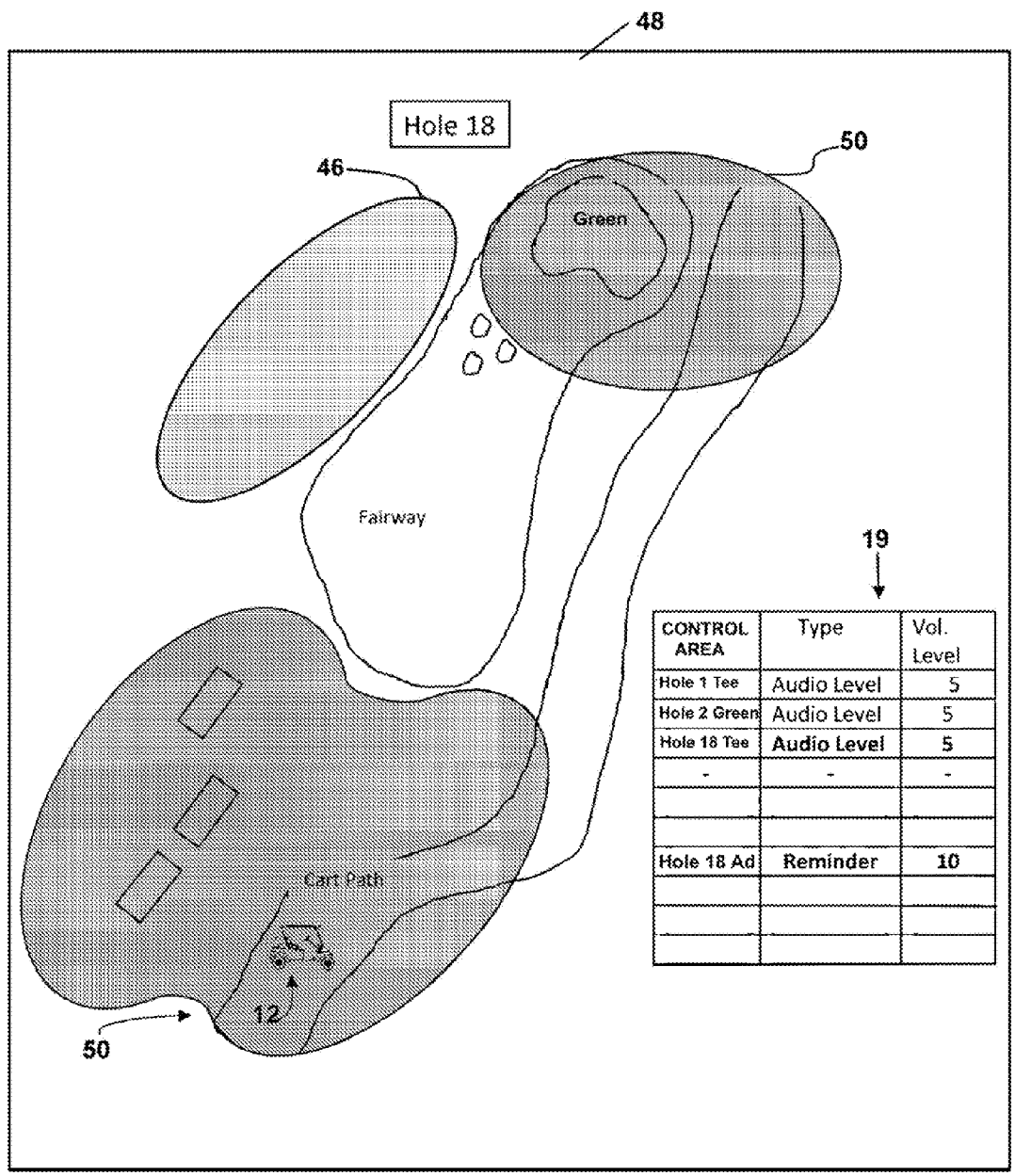
FIG. 5 depicts an example of determined control areas on or adjacent an individual fairway each of which has maximum determined volume levels and shows locations outside such areas which would allow higher volumes.
Figure 6:
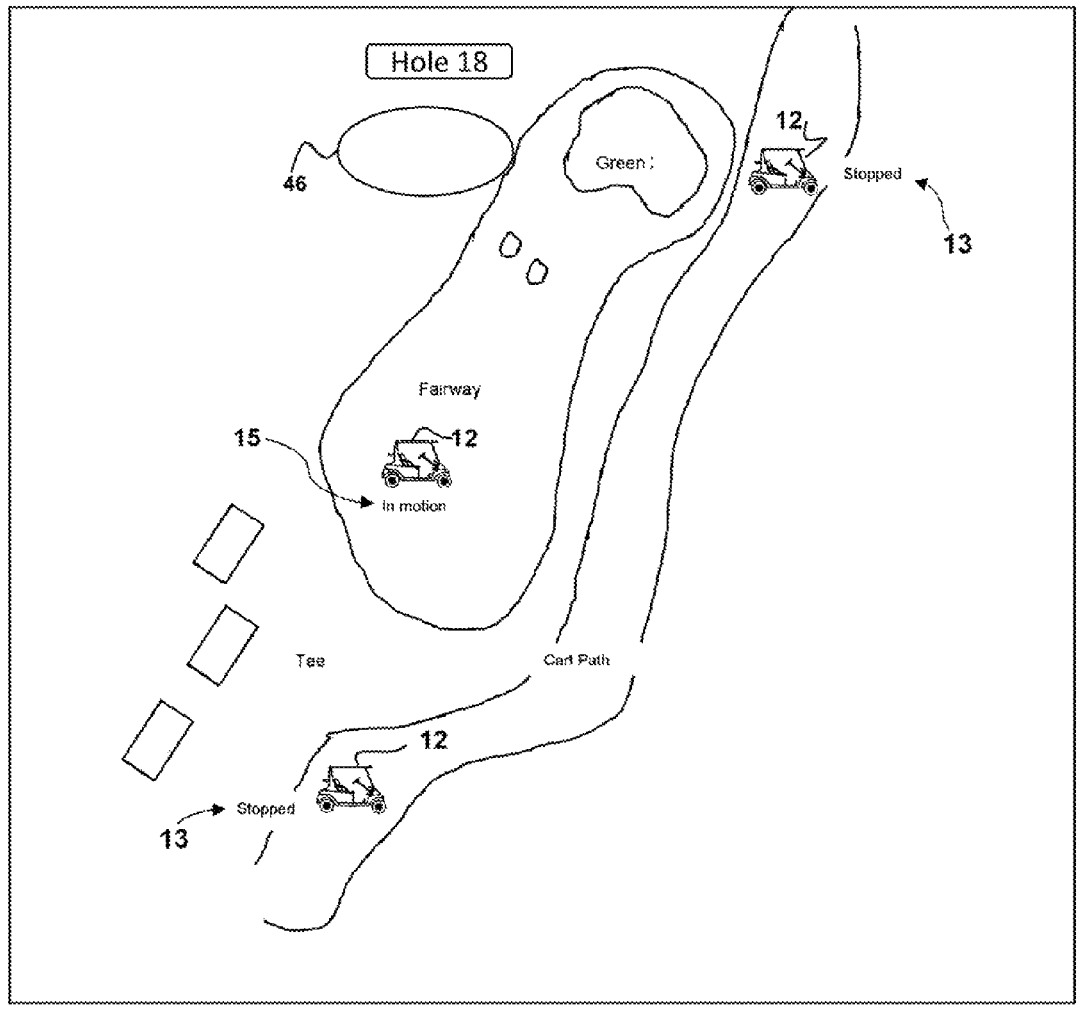
FIG. 6 depicts another area of the golf course where the location receiver or accelerometer senses cessation of movement causing an automatic lowering of loudspeaker volume.

FIGS. 5-6 show representations of the device 10 herein employed on golf carts 12, on a section of a golf course. FIG. 5 depicts a graphic interface 48 which may be provided to the course management, allowing them to input the name or section of the course and associate it with a maximum output audio volume level for the map co-ordinates 30 associated with that position in a control area 50, or surrounding it on a golf course. The interface 48 would have pixels which are pre associated with map coordinates 30 correlating to terrestrial positions of ad areas 46 and/or control areas 50 on the course. Thus, a control area 50 may be designated by, for example, a circle surrounding an area such as a green or tee, and the pixels within will automatically correlate to all the map coordinates associated in the area within a marked control area 50. When a cart 12 enters an area as determined by the location signal communicated to the location software by the locational receiver 26, the volume control software will automatically lower the output audio volume level of the loudspeakers 20, if needed, to below the designated maximum.

More particularly, FIG. 6 depicts areas of the golf course where the location receiver 26 and/or accelerometers operatively communicate an electronic location signal signifying movement of the cart 12 has ceased 13. The sound control software running in electronic memory 18 and on the computing component 16 upon receiving a location signal signifying nonmovement, will electronically switch the audio input signal or audio output signal of the audio amplifier 14 to cause a lowering of the output audio volume level of the loudspeaker 20. Currently, this automatic lowering of volume is in a range of 3 db to 6 dB from a volume of the loudspeakers 20 at the moment when movement cessation is sensed.

When the location receiver 26 and/or accelerometer 32 senses resumption of movement 15 of the cart 12 subsequent to such a cessation, a movement signal from location software is communicated to the sound control software running in electronic memory 18 and on the computing component 16, and the sound control software will initiate an automatic increase in the broadcast volume of the loudspeakers 20. The volume is automatically raised in a range of increase by 3 dB to 6 dB, from the volume level of the loudspeakers 20 while the cart 12 was determined as stationary or not moving.

In a method for controlling the volume of media broadcast by loudspeakers on golf carts on a golf course, in a first step all golf cart 12 occupants who wish to have music or other media broadcast by loudspeakers 20 on a cart 12, are required to pair a Bluetooth enabled user device 11 with a Bluetooth receiver 28 operatively connected to an audio amplifier 12. Thereafter, the location of the golf cart 12 on the course will be continually determined by a location receiver 26. Based on a location signal communicated from the location receiver 26 to a computing component 16, location software running in electronic memory 18 and upon the computing component 16 will match the location signal to map coordinates 30 on the golf course. If the map coordinates fall within a control area 50 on the course, such will be communicated to the sound control software running in electronic memory 18 which will find a predetermined volume level for the loudspeakers in the determined control area 50, and reduce the volume of sound emanating from the loudspeakers 20 by controlling switching in the amplifier 14 to lower the volume level to one associated in a database in electronic memory, with the determined control area 50.

Optionally, if the map coordinates determined show the cart 12 is located within an ad area, an advertisement associated with the determined ad area, and stored in electronic memory 18, will be played over the loudspeakers 20.

Alternatively, the method can be employed to also increase the decibel level of media or music emanating from the loudspeakers 20 when an accelerometer 32 or the location receiver 26 determines the cart 12 is moving. When the sound control software running in electronic memory 18 and on the computing component 16 is signaled that the cart 12 is moving, it will initiate electronic switching in the amplifier 14, to increase the output volume from the loudspeakers 20 by between 3-6 db. Conversely, when the sound control software receives a signal the cart 12 is not moving or stationary, the sound control software will operate electronic switching in the amplifier 14, to decrease the volume of the loudspeakers 20 by between 3-6 db.

While all of the fundamental characteristics and features of the location determined volume control system herein have been shown and described herein, with reference to particular embodiments thereof, a latitude of modification, various changes and substitutions are intended in the foregoing disclosure and it will be apparent that in some instances, some features or steps in the invention may be employed without a corresponding use of other features or steps without departing from the scope of the invention as set forth. It should also be understood that various substitutions, modifications, and variations may be made by those skilled in the art without departing from the spirit or scope of the invention. Consequently, all such modifications and variations and substitutions are included within the scope of the invention as defined by the following claims.

What is claimed is:

1. An audio amplification apparatus configured for attachment to a golf cart used for traversing a golf course, comprising:
    an electric power converter connected to an input of an electric power system of said golf cart and having an output providing electric power to said amplification apparatus;
    said amplification apparatus having an audio amplifier having an input for an input audio signal to be amplified, and having an output communicating an amplified audio signal to an engaged loudspeaker;
    a Bluetooth receiver configured to form a wireless connection with a user electronic device outputting said input audio signal;
    said Bluetooth receiver in an operative connection to said input of said audio amplifier to thereby communicate said input audio signal thereto;
    a location receiver for ascertaining a terrestrial location of said golf cart upon said golf course, said location receiver outputting a location signal relative to said terrestrial location;
    a computing component, said computing component engaged with electronic memory, said electronic memory having an electronic database of map coordinates for terrestrial positions on said golf course, stored electronically thereon;
    said electronic memory having an electronic database identifying all said map coordinates which are positioned within one or a plurality of control areas on said golf course;
    a sound control database stored in said electronic memory associating a maximum audio output volume level to be emitted by said loudspeaker while said golf cart is in a said terrestrial location within a said control area;
    sound control software operating in said electronic memory to electronically control an output audio volume level of said loudspeaker by adjusting a level of said amplified audio signal communicated to said loudspeaker;
    location software operating in said electronic memory to receive said location signal from said location receiver and ascertain respective said map coordinates of a current respective said terrestrial location of said golf cart; and
    said location software operating to communicate to said sound control software a determination that said current respective terrestrial location of said golf cart is within a said control area whereupon said sound control software operates to adjust said amplified audio signal to said engaged loudspeaker and limit emitted sound therefrom to said maximum audio output volume level or less.

2. The audio amplification apparatus configured for attachment to a golf cart of claim 1, additionally comprising:
    at least one of said control areas being designated an advertisement area; and
    said location software operating to communicate to said sound control software a determination that said current respective terrestrial location of said golf cart is within a said advertisement area whereupon said sound control software operates to play an advertisement stored in said electronic memory through said loudspeaker.

3. The audio amplification apparatus configured for attachment to a golf cart of claim 1, additionally comprising:
    said location receiver outputting a location signal relative to said terrestrial location which indicates said cart is either stationary or moving;
    said sound control software operating to increase said amplified audio signal to said engaged loudspeaker to increase said level of said emitted sound therefrom, when said location signal indicates said cart is moving; and
    said sound control software operating to decrease said amplified audio signal to said engaged loudspeaker decreasing said level of said emitted sound therefrom, when said location signal indicates said cart is stationary.

4. The audio amplification apparatus configured for attachment to a golf cart of claim 2, additionally comprising:
    said location receiver outputting a location signal relative to said terrestrial location which indicates said cart is either stationary or moving;
    said sound control software operating to increase said amplified audio signal to said engaged loudspeaker to increase said level of said emitted sound therefrom, when said location signal indicates said cart is moving; and
    said sound control software operating to decrease said amplified audio signal to said engaged loudspeaker decreasing said level of said emitted sound therefrom, when said location signal indicates said cart is stationary.

5. The audio amplification apparatus configured for attachment to a golf cart of claim 3, wherein said increase of said level of said emitted sound from said loudspeaker is an increase in a range between 3-6 dB and said decrease of said level of emitted sound from said loudspeaker is in a range between 3-6 dB.

6. The audio amplification apparatus configured for attachment to a golf cart of claim 4, wherein said increase of said level of said emitted sound from said loudspeaker is an increase in a range between 3-6 dB and said decrease of said level of emitted sound from said loudspeaker is in a range between 3-6 dB.

7. The audio amplification apparatus configured for attachment to a golf cart of claim 1, additionally comprising:
    a wireless network card in operative engagement with said computing component engaged with said electronic memory; and
    communications software running in electronic memory whereby said electronic database of map coordinates is updated via a wireless signal communicated to said network card from a remote server.

8. The audio amplification apparatus configured for attachment to a golf cart of claim 2, additionally comprising:

a wireless network card in operative engagement with said computing component engaged with said electronic memory; and communications software running in electronic memory whereby said electronic database of map coordinates is updated via a wireless signal communicated to said network card from a remote server.

9. The audio amplification apparatus configured for attachment to a golf cart of claim 1, wherein said location receiver is one or a combination of receivers from a group including, a GPS receiver, a receiver configured for cellular triangulation, an accelerometer which can access movement and speed to determine location, and a receiver configured for signals from a golf course positioned beacon.

10. The audio amplification apparatus configured for attachment to a golf cart of claim 2, wherein said location receiver is one or a combination of receivers from a group including, a GPS receiver, a receiver configured for cellular triangulation, an accelerometer which can access movement and speed to determine location, and a receiver configured for signals from a golf course positioned beacon.

11. The audio amplification apparatus configured for attachment to a golf cart of claim 3, wherein said location receiver is one or a combination of receivers from a group including, a GPS receiver, a receiver configured for cellular triangulation, an accelerometer which can access movement and speed to determine location, and a receiver configured for signals from a golf course positioned beacon.

12. The audio amplification apparatus configured for attachment to a golf cart of claim 4, wherein said location receiver is one or a combination of receivers from a group including, a GPS receiver, a receiver configured for cellular triangulation, an accelerometer which can access movement and speed to determine location, and a receiver configured for signals from a golf course positioned beacon.

13. The audio amplification apparatus configured for attachment to a golf cart of claim 5, wherein said location receiver is one or a combination of receivers from a group including, a GPS receiver, a receiver configured for cellular triangulation, an accelerometer which can access movement and speed to determine location, and a receiver configured for signals from a golf course positioned beacon.

14. The audio amplification apparatus configured for attachment to a golf cart of claim 6, wherein said location receiver is one or a combination of receivers from a group including, a GPS receiver, a receiver configured for cellular triangulation, an accelerometer which can access movement and speed to determine location, and a receiver configured for signals from a golf course positioned beacon.

15. The audio amplification apparatus configured for attachment to a golf cart of claim 7, wherein said location receiver is one or a combination of receivers from a group including, a GPS receiver, a receiver configured for cellular triangulation, an accelerometer which can access movement and speed to determine location, and a receiver configured for signals from a golf course positioned beacon.

16. The audio amplification apparatus configured for attachment to a golf cart of claim 8, wherein said location receiver is one or a combination of receivers from a group including, a GPS receiver, a receiver configured for cellular triangulation, an accelerometer which can access movement and speed to determine location, and a receiver configured for signals from a golf course positioned beacon.

17. The audio amplification apparatus configured for attachment to a golf cart of claim 1, additionally comprising:

a volume sampling component to measure an audio output volume level emitted by said loudspeaker; and said volume sampling component communicating a volume level signal to said sound control software.

18. The audio amplification apparatus configured for attachment to a golf cart of claim 1, additionally comprising:

a volume sampling component to measure an audio output volume level emitted by said loudspeaker; and said volume sampling component communicating a volume level signal to said sound control software.

19. The audio amplification apparatus configured for attachment to a golf cart of claim 5, additionally comprising:

a volume sampling component to measure an audio output volume level emitted by said loudspeaker; and said volume sampling component communicating a volume level signal to said sound control software.

20. The audio amplification apparatus configured for attachment to a golf cart of claim 9, additionally comprising:

a volume sampling component to measure an audio output volume level emitted by said loudspeaker; and said volume sampling component communicating a volume level signal to said sound control software.

* * * * *